United States Patent [19]

Amemiya et al.

[11] 4,210,996

[45] Jul. 8, 1980

[54] TRIMMING METHOD FOR RESISTANCE VALUE OF POLYCRYSTALLINE SILICON RESISTORS ESPECIALLY USED AS SEMICONDUCTOR INTEGRATED CIRCUIT RESISTORS

[75] Inventors: Yoshihito Amemiya, Fuchu; Kotaro Kato, Chofu, both of Japan

[73] Assignee: Nippon Telegraph and Telephone Public Corporation, Japan

[21] Appl. No.: 900,300

[22] Filed: Apr. 26, 1978

[30] Foreign Application Priority Data

May 4, 1977 [JP] Japan .................................. 52/51388

[51] Int. Cl.² .......................................... H01H 10/00
[52] U.S. Cl. .................................. 29/610 R; 29/620; 330/199
[58] Field of Search ..................... 29/610 R, 593, 613, 29/620; 338/195, 308; 330/199; 430/347 CC

[56] References Cited

U.S. PATENT DOCUMENTS

| | | | |
|---|---|---|---|
| 3,261,082 | 7/1966 | Maissel | 29/610 |
| 3,308,528 | 3/1967 | Bullard | 29/610 |
| 3,890,610 | 6/1975 | Cahen | 340/347 CC |
| 4,131,884 | 12/1978 | Comer | 340/347 CC |
| 4,138,671 | 2/1979 | Comer | 340/347 CC |

Primary Examiner—Francis S. Husar
Assistant Examiner—Gene P. Crosby
Attorney, Agent, or Firm—Charles W. Helzer

[57] ABSTRACT

Current having a density higher than a critical value is passed through a polycrystalline resistor doped with impurities at a concentration higher than a critical value to decreasingly correct the initial value of the resistance, thereby trimming the resistance value of the resistor. When the resistor is used in a semiconductor integrated circuit, the current is passed through the existing (not additional) terminals of the integrated circuit.

11 Claims, 8 Drawing Figures

TRIMMING METHOD FOR RESISTANCE VALUE OF POLYCRYSTALLINE SILICON RESISTORS ESPECIALLY USED AS SEMICONDUCTOR INTEGRATED CIRCUIT RESISTORS

BACKGROUND OF THE INVENTION

This invention relates to a method of trimming the resistance value of a polycrystalline silicon resistor, more particularly a method of trimming by electrical means the value of a polycrystalline silicon resistor utilized as the resistance element of a semiconductor integrated circuit.

The resistance value of a resistance element incorporated into an integrated citcuit generally deviates from the designed value, due to variation in the manufacturing condition of the resistance element. To achieve the accuracy required beyond the limits of manufacturing condition, it is common practice to use one of the two trimming methods. The first method is laser trimming of a thin film metal resistor, disclosed in a paper "An Integrated Circuit 12 Bit D/A Converter" by R. B. Craven, ISSCC Digest of Technical Papers, pages 40–41, 1975 and a paper "A High Yield Second Generation 10 Bit Monolithic DAC" by P. Holloway et al, ISSCC Digest of Technical Papers, pages 106–107, 1976. The second method is selective short-circuiting of zener diodes by a large current to produce correctional circuits, disclosed in a paper "A Precision Trim Technique for Monolithic Analogue Circuits" by G. Erdi, ISSCC Digest of Technical Papers, pages 192–193, 1975, and a paper "A Monolithic 12 Bit D/A Counter" by D. T. Comer, ISSCC, Digest of Technical Papers, pages 104–105, 1977.

However, the method of trimming the thin metal film resistor by a laser beam introduces stress caused by local heating of the resistor, thus causing instability. Moreover, as the resistance value of the resistance element is trimmed before it is mounted on the package, the resistance value may be caused to vary by the heat treatment of the package. Furthermore, it is necessary for the laser trimming to use an expensive trimming equipment. On the other hand, the method of selective short-circuiting of zener diodes by large current cannot correct the resistance value directly, so that complicated and space consuming additional correctional circuits are required, resulting in a low yield of the product. In typical semiconductor integrated circuits available on the market, the area of the adjusting circuit is so large that about one half the area of the chip is occupied by the adjusting circuit.

Accordingly, it has been desired to establish a method of trimming the resistance value of a resistance element to be incorporated into an integrated circuit so as to readily correct the resistance value to within desired limits after fabrication of the resistor element in the integrated circuit. The provision of a simple and precise trimming method suitable for polycrystalline silicon resistors is highly desirable and valuable because polycrystalline silicon resistors are quite suitable for use in fabricating monolithic integrated circuits.

SUMMARY OF THE INVENTION

It is therefore an object of this invention to provide a novel method of trimming the resistance value of a polycrystalline silicon resistor which is capable of readily and precisely correcting the resistance value of the resistor after it has been prepared.

Another object of this invention is to provide a novel method of trimming the resistance value of a polycrystalline silicon resistor utilized as a resistance element of a semiconductor integrated circuit and which is capable of correcting the resistance value after the fabrication of the integrated circuit by using the existing (not additional) terminals of the integrated circuit.

A further object of this invention is to improve the accuracy of a resistance element included in a semiconductor integrated circuit.

According to this invention there is provided a method of trimming the resistance value of a polycrystalline silicon resistor, especially the initial resistance value of a polycrystalline silicon resistor utilized as a resistance element of a semiconductor integrated circuit, the method comprising the steps of forming a resistor having a predetermined initial resistance value by doping an impurity into polycrystalline silicon at a concentration higher than $1 \times 10^{20}$ atoms/cm$^3$, and passing current through the resistor from an external power supply at a current density higher than $1 \times 10^6$ A/cm$^2$ so as to decrease the initial resistance value thereby correcting the resistance value of the resistor.

BRIEF DESCRIPTION OF THE DRAWINGS

The other objects and advantages of the invention can be more fully understood from the following detailed description taken in conjunction with the accompanying drawings in which.

DESCRIPTION OF THE PREFERRED EMBODIMENTS

While investigating the phenomena which occur when large current is passed through a polycrystalline silicon resistor for the purpose of improving the accuracy of a resistor network (which is utilized in an analogue-digital converter) to adjust the resistance values thereof, we have found the following facts and the invention is based thereon.

1. The resistance value of a polycrystalline silicon resistor containing an impurity in an amount higher than a critical concentration decreases continuously when current exceeding a critical density is passed through the resistor and the decrease in the resistance value stops when the flow of the current above the critical value is stopped. Thereafter, the resistance value at the time and value of current when the excessive current flow stops is maintained. This phenomenon is not influenced by the method of doping the impurity and occurs whether the impurity is doped at the time of growing the polycrystalline silicon, or by thermal diffusion or by ion implantation technique. Moreover, the critical value of the concentration is not influenced by the type of the impurities commonly used such as P, As, Sb and B, and the critical value of the current density is also substantially constant irrespective of the type of impurity. Also, this holds true for impurities of optional combinations of P, As, Sb and B.

2. So long as the density of the current flowing through the polycrystalline silicon resistor is lower than the critical value, the resistance value does not thereafter vary.

Figure 1:
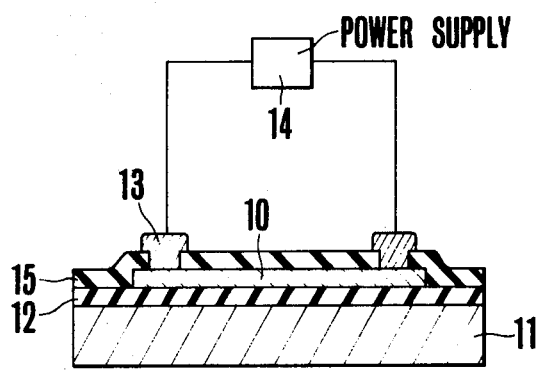
FIG. 1 is a diagrammatic representation showing a manner of connecting a polycrystalline silicon resistor manufactured by the method of the invention to a source of power.

Accordingly, in accordance with this invention, a desired current is passed through a polycrystalline silicon resistor in a semiconductor integrated circuit as shown in FIG. 1 from an external power supply (current source) for trimming the resistance value. In FIG. 1, a polycrystalline silicon resistor 10 to be trimmed is formed on an insulating layer 12 comprising a silicon dioxide film overlying a silicon substrate 11 and metal contacts 13 (for example aluminum electrodes) are secured to the opposite ends of the resistor 10 for passing current through these metal contacts. The external current source may be of DC, AC or pulse current as long as it can supply current having a densitity above a critical value to the resistor 10. As will be described later, the critical current density is about $1 \times 10^6$ A/cm$^2$. An SiO$_2$ insulating film 15 is applied to cover the resistor 10.

Figure 2:
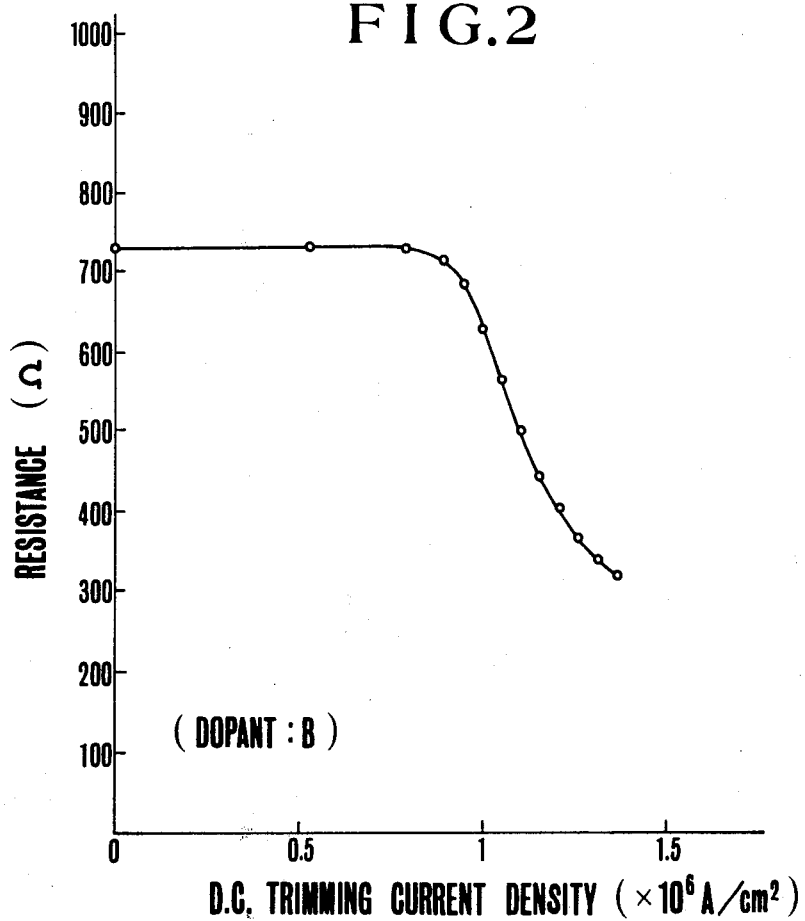
FIG. 2 is a graph showing a resistance value trimming characteristic obtained by the invention.

FIG. 2 is a graph showing one example of the resistance decrease when DC current is passed through the polycrystalline silicon resistor. The sample was prepared by growing non-doped polycrystalline silicon at a temperature of 670° C., thereafter doping boron by ion implantation, heat-treating a resultant doped polycrystalline silicon in N$_2$ gas at a temperature of 1000° C. for 80 minutes, forming the doped polycrystalline silicon into a resistor having a width of 9 microns and a length of 100 microns by conventional photolithographic process and attaching aluminum electrodes to the resistor as shown in FIG. 1. The concentration of doped boron was $2.4 \times 10^{20}$/cm$^3$, and the resistance value before current flow (initial resistance value) was 730 ohms.

As can be noted from FIG. 2, while the current density is small, the resistance does not vary even when current is passed but decreases when the current density exceeds a certain critical value. In the case of this sample, the critical value was about $8 \times 10^5$ A/cm$^2$. The current was passed for 15 seconds from a DC current source for every experiment at different current density.

As the current density is increased above the critical value, the resistance value decreases continuously as shown. Of course, excessively large current should not be passed because metal electrodes melt. The current density at the metal electrodes varies depending upon the physical dimension thereof, and larger dimension is obviously advantageous. In any case, when trimming the resistor by the method of this invention, the melting of the metal electrodes is the only and principal factor for determining the upper limit of the current density.

In addition to the sample described above, a sample in which boron was doped at the time of growing the polycrystalline silicon, and a sample in which boron was doped by thermal diffusion process were also tested. In this test, the same phenomenon was observed and the critical value of the current density was substantially the same so long as the boron concentration was higher than $1 \times 10^{20}$/cm$^3$.

With regard to such other impurities as As, P and Sb, experiment was made for various impurity concentrations and with various methods of doping, but it was found that the tendency of decreasing the resistance value was similar to that shown in FIG. 2 and that the critical value of the current density was also similar so long as the impurity concentration is higher than $1 \times 10^{20}$/cm$^3$. However, the critical value of the current density varied ±20 to 30% dependent upon the deviation of the manufacturing conditions. In this invention, there is no upper limit of the impurity concentration, but it is theoretically impossible to dope impurities above an extremity of concentration determined by Avogadro number.

As described above a phenomenon on which the invention is based is specific to the polycrystalline silicon resistor. In a sample of single crystalline silicon doped with an impurity at a high concentration, the phenomenon described above was not observed at all. More particularly, when current was passed through a single crystalline silicon resistor doped with B, As, P or Sb up to a solubility limit, resistance decrease was not observed in any sample, with a current flow within a range in which aluminum electrodes will not melt.

Figure 3:
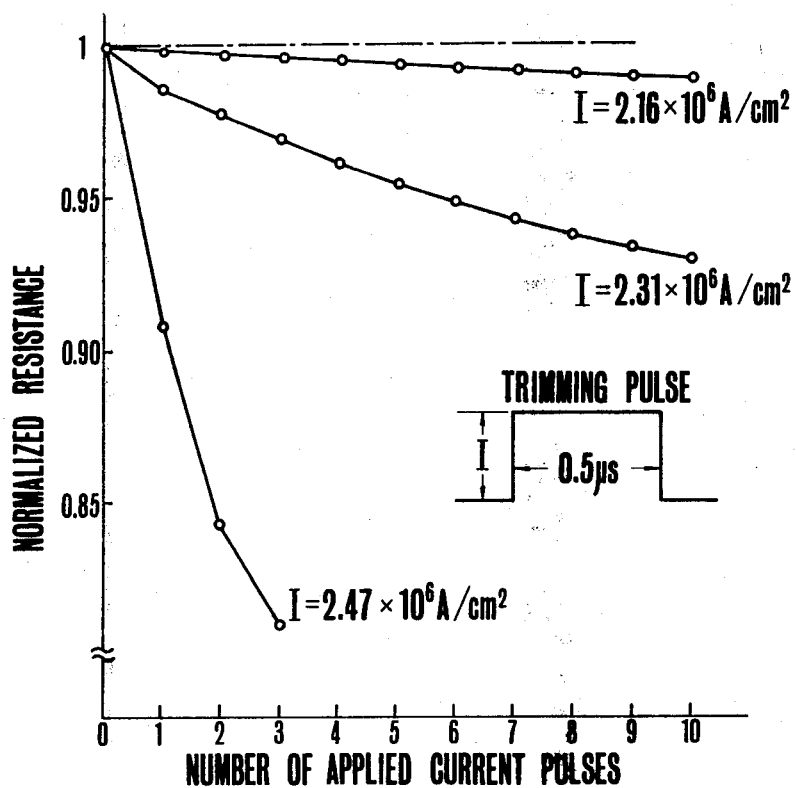
FIG. 3 is a graph showing other characteristics obtained by the invention.

FIG. 3 shows one example of the fact that the resistance value of a polycrystalline silicon resistor is also decreased by the passage of pulse current. The dimension of the sample was the same as that of FIG. 2 but in this example, the polycrystalline silicon was doped with As at a concentration of $1.2 \times 10^{21}$/cm$^3$. In this example, the resistance value was trimmed by passing a pulse current having a width of 0.5 μsec. and, as shown in FIG. 3, it is possible to freely control the amount of trimming over a wide range by adjusting the peak value of the current density and the number of applied pulses. Thus, it is quite easy to control the amount of trimming with an accuracy of 0.01%. In FIG. 3, the ordinate shows the normalized resistance taking the initial resistance before the passage of the pulse as unity.

According to this example, when pulse current is passed, substantially the same trimming effect as in DC conduction can be obtained irrespective of the type of impurity and method of doping the same. In the method of trimming by passing pulse current, the number of applications of pulse i.e., the total pulse conduction time can be controlled more easily as compared with DC current conduction time. Thus, the method of trimming with pulse current is extremely advantageous. Although the result of experiment is not described herein, it was confirmed that, with AC current conduction, advantageous result similar to that of DC and pulse current can also be obtained.

Figure 4:
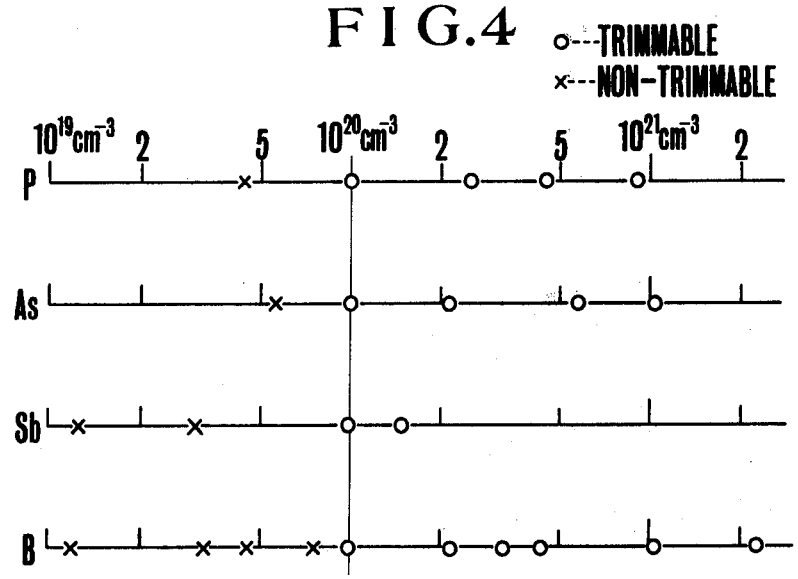
FIG. 4 is a diagrammatic representation showing the critical value of the impurity concentration that manifests the novel effect of the invention.

FIG. 4 shows impurity concentrations necessary to trim the resistance value of the polycrystalline silicon resistors. The critical value of the impurities for causing the aforementioned resistance reduction is $1 \times 10^{20}$/cm$^3$ for each one of As, P, B, and Sb, provided that the accuracy of concentration measurement is ±20%. It was found that the trimming accuracy is not influenced by the impurity concentration so long as the impurity concentration is higher than the critical value.

Although the detail of the mechanism of decreasing the resistance value of the polycrystalline silicon resistor containing impurities at a high concentration caused by the method of this invention is not yet completely understood, at least the following facts have been cleared by our experiment:

(1) Electrode metal does not contribute to the resistance decrease. As a result of the detailed measurement of the resistivity variation at various portions of the resistor, it was found that resistance decrease has occurred uniformly throughout the bulk of the polycrystalline silicon resistor irrespective of the distance from the electrode.

Figure 5:
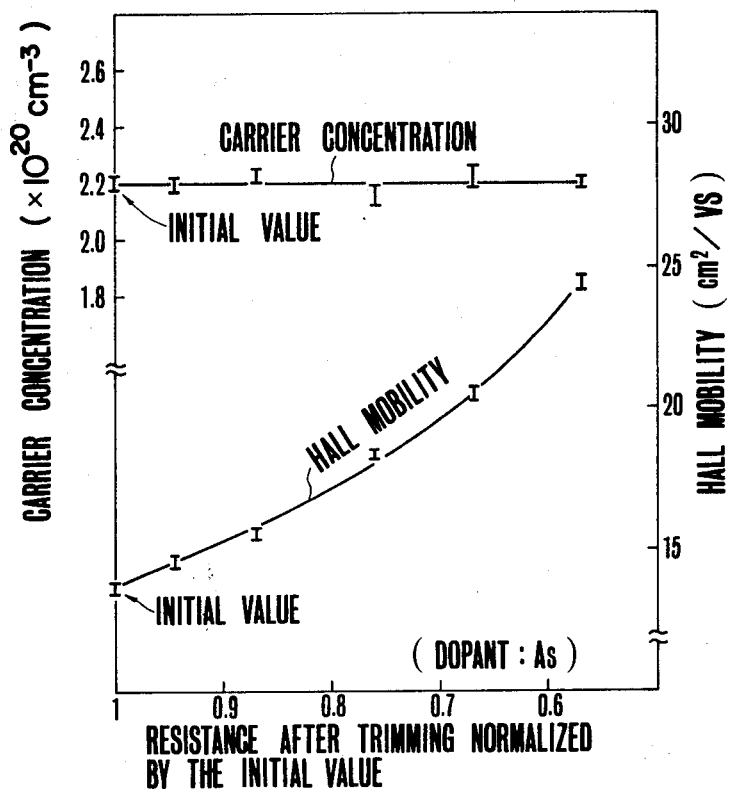
FIG. 5 is a graph showing the mechanism of the phenomenon on which the invention is based.

(2) Decrease in the resistance value is caused by the increase in the carrier mobility of the polycrystalline silicon whereas the carrier concentration does not change even when the resistor is trimmed. This fact was made clear by the measurement of Hall coefficient of the polycrystalline silicon. This is shown in FIG. 5.

(3) Decrease in the resistance value does not occur in single crystalline silicon as has been pointed out hereinbefore.

(4) The critical value of the impurity concentration necessary to cause resistance decrease is substantially equal to an impurity concentration at which the resistivity of the polycrystalline silicon begins to saturate with respect to the impurity concentration.

For the facts described above, it is considered that where an impurity is doped at a high concentration, the carrier mobility prescribed by the grain boundary is caused to increase by some causes when current is passed at a high current density, thereby decreasing the resistivity.

As described above, the invention contemplates decrease of the initial resistance value of the polycrystalline silicon resistor by passing electric current through the resistor, thereby continuously trimming the same at the time of preparing the resistor. In this invention, it is not intended to extremely decrease (nearly to zero) the initial resistance value. Accordingly, the method of this invention is applied to a polycrystalline silicon resistor for use in a semiconductor integrated circuit for the exclusive purpose of accomplishing the precise trimming of the resistor incorporated into the integrated circuit but is not applied for the purpose of attaining the memory function in the integrated circuit.

Figure 6:
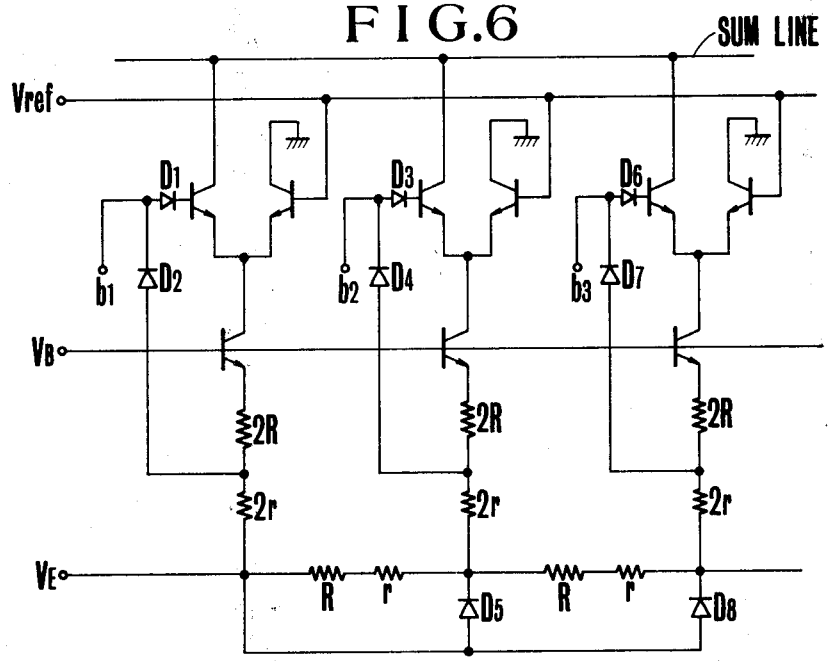
FIG. 6 is a connection diagram showing the application of the invention to the correction of a resistor network of a digital-analogue converter.

An example of an application to the precise trimming will be described in the following. FIG. 6 shows an example wherein the invention is applied to a D/A converter. FIG. 6 shows 3 bit parts of a digitalanalogue converter with a weighted constant current source. The newly added elements for carrying out the invention are resistors r and 2r and diodes $D_1$ through $D_8$. Other elements are identical to those used in a conventional digital-analogue converter with a weighted constant current DC source (for example, μPC610D, DAC90 or mono DAC02). The resistor 2r comprises a heavily doped polycrystalline silicon resistor which is finely trimmed to improve the accuracy of the resistor network. The purpose of resistor r, also made of a heavily doped polycrystalline silicon, is to prevent unbalance of the resistor network caused by the addition of resistor 2r. The cross-sectional areas of resistors 2r and r in a direction perpendicular to the current flow are designed such that the current density should be less than the critical value for the normal operating current of the D/A converter. The diodes $D_1$ through $D_8$ are added for the purpose of preventing a large current from passing through other resistors and transistors when trimming the resistor 2r. As is well known in the art, since the resistance ratio between 2R+2r and R+r related to each bit should be accurately 2:1, the resistor 2r is to be trimmed for each bit.

The trimming is performed in the following manner. For example, to trim the resistor 2r of the central bit shown in FIG. 6, an external current source, not shown, is connected across a voltage terminal $V_E$ and an input terminal $b_2$ with $b_2$ negative with respect to $V_E$ for passing the trimming current. Terminals $b_1$ and $b_3$ are maintained at a suitable potential (usually ground level) which is positive with respect to $V_E$. Then, diodes $D_4$ and $D_5$ are forwardly biased whereas other diodes are reversely biased so that the trimming current flows through a path $V_E \rightarrow D_5 \rightarrow 2r \rightarrow D_4 \rightarrow b_2$ to trim the resistor 2r only of the central bit and any large current does not flow through other resistors and transistors. Symbol $V_B$ represents a standard bias terminal for the current source transistor, and $V_{ref}$ a reference voltage terminal for the current switch transistor.

For normal digital-analogue converter operation, on the other hand, the digital-analogue converter is disconnected from the external current source and an input signal which is positive with respect to the voltage terminal $V_E$ is impressed upon the input terminals $b_1$, $b_2$ and $b_3$ so that the diodes $D_2$, $D_4$, $D_7$, $D_5$ and $D_8$ are reversely biased. Accordingly, all paths for the trimming current would be interrupted. Further, when the input signal is applied to the input terminals, diodes $D_1$, $D_3$ and $D_6$ are forwardly biased so that the circuit can operate as a digital-analogue converter.

With the construction described above, it is possible to desirably trim a polycrystalline silicon resistor by using the voltage terminal and the input terminal of a D/A converter so that it is not necessary to provide any additional terminal for the trimming.

Figure 7A:
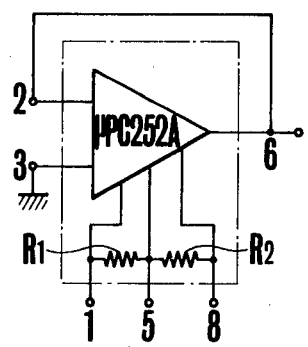
FIG. 7A is a connection diagram showing the application of the invention to the adjustment of the offset voltage of a MOS-input operational amplifier; and, FIG. 7B is a graph showing the effect of adjusting the offset voltage shown in FIG. 7A.

FIG. 7A shows one example wherein the invention is applied to adjust the offset voltage of a MOS-input operational amplifier, in which reference numerals 2 and 3 designate input terminals of the operational amplifier, 6 an output terminal, and 1, 5, 8 are terminals for adjusting the offset voltage. In this case, a commercial μPC 252A manufactured by Nippon Electric Co., Ltd. is used as the operational amplifier with its terminals 2 and 6 short-circuited and its terminal 3 grounded to thereby produce an offset voltage at the output terminal 6. Polycrystalline silicon resistors $R_1$ and $R_2$ of this invention are respectively connected across terminals 1 and 5 and across terminals 5 and 8, and the offset voltage can be decreased by trimming these resistors.

Figure 7B:
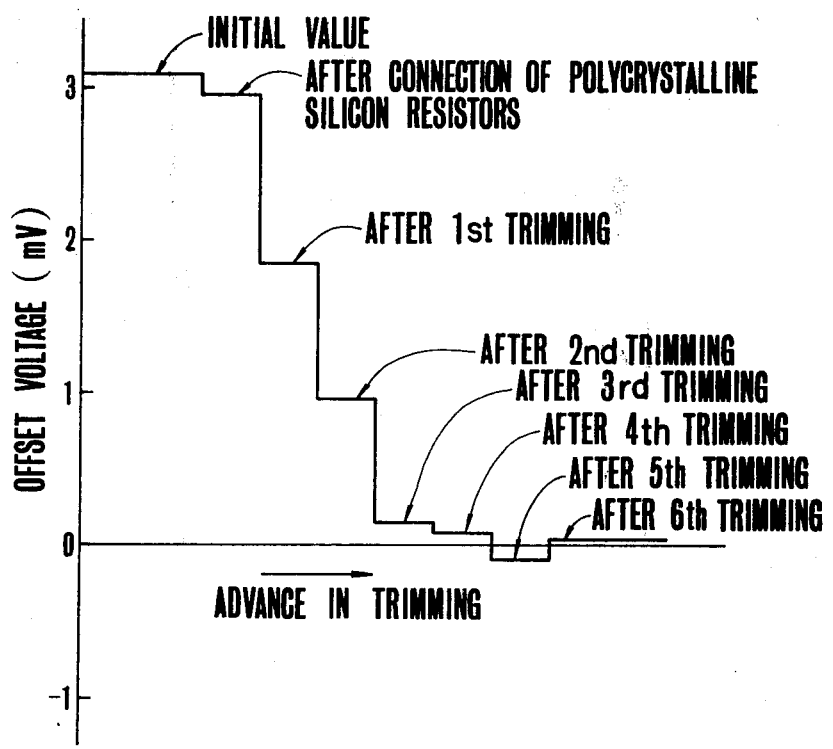

As shown in FIG. 7B, the initial value of the offset voltage of the operational amplifier, which is measured when the terminals 1, 5 and 8 are short-circuited, is 3.08 mV. The offset voltage decreases to about 2.98 mV when the polycrystalline silicon resistors $R_1$ and $R_2$ of this invention are connected as shown in FIG. 7A. Thereafter, when the polycrystalline silicon resistors are trimmed by connecting an external source across terminals 1 and 5 or 5 and 8, the offset voltage can eventually be reduced to an ultimate value of 0.02 mV. In FIG. 7B, up to the fifth trimming operation, resistor $R_1$ connected between terminals 1 and 5 was trimmed. However, as the fifth trimming was excessive, in the sixth trimming operation the resistor $R_2$ connected between terminals 5 and 8 was trimmed to compensate for such as excessive trimming.

In this example, the polycrystalline silicon resistors are connected on the outside of the operational amplifier. However, by incorporating the resistors into the operational amplifier during the fabrication thereof, it is possible to precisely adjust the offset before shipping.

As described above, according to this invention, it is possible to precisely trim a polycrystalline silicon resistor by merely passing a trimming current through the resistor which is larger than the operating current of a semiconductor integrated circuit.

We claim:

1. A method of trimming the resistance value of a polycrystalline silicon resitor, especially the initial resistance value of a polycrystalline silicon resistor utilized as a resistance element of a semiconductor integrated circuit, said method comprising the steps of forming a resistor having a predetermined initial resistance value by doping an impurity into polycrystalline silicon at a concentration higher than $1 \times 10^{20}$ atoms/cm$^3$, and passing current through said resistor from an external power supply at a current density higher than $1 \times 10^6$ A/cm$^2$ so as to decrease said initial resistance value, thereby correcting the resistance value of the resistor.

2. The method according to claim 1 wherein said external power supply comprises a direct current source.

3. The method according to claim 1 wherein said external power supply comprises a sourse of pulse current.

4. The method according to claim 1 wherein current is passed through existing terminals of the semiconductor integrated circuit.

5. The method according to claim 1 wherein said impurity is phosphorous.

6. The method according to claim 1 wherein said impurity is antimony.

7. The method according to claim 1 wherein said impurity is arsenic.

8. The method according to claim 1 wherein said impurity is boron.

9. The product of the method set forth in claim 1.

10. A digital-analogue converter comprising, as a component of a weighted current source, a polycrystalline silicon resistor, said polycrystalline silicon resistor being doped with an impurity at a concentration higher than $10^{20}$ atoms/cm$^3$ and connected with a current path through which an electric current with a density higher than $10^6$ A/cm$^2$ is passed for trimming said polycrystalline silicon resistor.

11. An operational amplifier including as a component a polycrystalline silicon resistor for adjusting the offset voltage of the operational amplifier, said polycrystalline silicon being doped with an impurity at a concentration higher than $10^{20}$ atoms/cm$^3$ and connected with a current path through which an electric current with a density higher than $10^6$ A/cm$^2$ is passed for trimming said polycrystalline silicon resistor to thereby adjust the offset voltage of the operational amplifier.

* * * * *